(12) United States Patent
Desvaux et al.

(10) Patent No.: US 7,564,243 B2
(45) Date of Patent: Jul. 21, 2009

(54) METHOD FOR ENHANCING THE NMR SIGNAL OF A LIQUID SOLUTION

(75) Inventors: Hervé Desvaux, Orsay (FR); Lionel Dubois, Verrens-Arvey (FR)

(73) Assignee: Commissariat a l'Energie Atomique (FR)

( * ) Notice: Subject to any disclaimer, the term of this patent is extended or adjusted under 35 U.S.C. 154(b) by 43 days.

(21) Appl. No.: 11/814,747

(22) PCT Filed: Jan. 18, 2006

(86) PCT No.: PCT/FR2006/000109

§ 371 (c)(1),
(2), (4) Date: Aug. 21, 2007

(87) PCT Pub. No.: WO2006/079702

PCT Pub. Date: Aug. 3, 2006

(65) Prior Publication Data

US 2008/0204014 A1    Aug. 28, 2008

(30) Foreign Application Priority Data

Jan. 27, 2005   (FR) .................................. 05 00844

(51) Int. Cl.
*G01V 3/00*   (2006.01)
(52) U.S. Cl. ..................................... 324/308
(58) Field of Classification Search ......... 324/300–322; 600/410–435
See application file for complete search history.

(56) References Cited

U.S. PATENT DOCUMENTS 4,345,207 A * 8/1982 Bertrand et al. ............. 324/308

5,285,156 A * 2/1994 Bodenhausen et al. ...... 324/307

OTHER PUBLICATIONS

International Search Report for PCT/FR2006/000109 filed Jan. 18, 2006.

Tolman Jr, Prestegard Jh: "Relative signs of scalar and dipolar coupling in liquid crystals from spin-locked NMR experiments"; Journal of Magnetic Resonance, Series A; vol. 106, 1994; pp. 203-208; XP002419432.

Tjandra N, Bax A: "Direct measurement of distances and angles in biomolecules by NMR in a dilute liquid crystalline medium"; Science; vol. 278, Nov. 7, 1997; pp. 1111-1114; XP002419433.

(Continued)

*Primary Examiner*—Dixomara Vargas
(74) *Attorney, Agent, or Firm*—Alston & Bird LLP (57) ABSTRACT

The invention relates to an NMR analysis system and method for obtaining an NMR signal from a liquid solution enhanced in relation to the value that it would have on the basis of the thermodynamic equilibrium. It has been discovered in a surprising manner that if the spins of the cores of a highly-polarized polarization source and the spins of the cores of the liquid solution are irradiated such that a polarization transfer, such as a Hartmann-Hahn transfer, of the spins of the cores of the source to the spins of the cores of the liquid solution is carried out by means of a coherent coupling resulting from the dipolar field created by the cores of the source, an NMR signal of the liquid solution is obtained, said signal being significantly enhanced in relation to the value it would have on the basis of the thermodynamic equilibrium.

31 Claims, 6 Drawing Sheets

OTHER PUBLICATIONS

Chiarparin E et al: "Selective cross-polarization in solution state NMR"; Molecular Physics, London, GB; vol. 95, No. 5, 1998; pp. 759-767; XP000872079.

Zuider Weg E R P: "Analysis of multiple-pulse-based heteronuclear J cross polarization in liquids"; Journal of Magnetic Resonance, Academic Press, London, GB; vol. 89, No. 3, Oct. 1990; pp. 533-542; XP008053419.

Long HW et al: "High-field cross polarization NMR from laser-polarized Xenon to a polymer surface"; J AM Chem Soc.; vol. 115, 1993; pp. 8491-8492; XP002419434.

Navon G et al: "Enhancement of solution NMR and MRI with laser-polarized xenon"; Science, American Assocation for the Advancement of Science, US; vol. 271, Mar. 29, 1996; pp. 1848-1851; XP000749451.

Richter W et al: "Imaging with intermolecular multiple-quantum coherences in solution nuclear magnetic resonance"; Science; vol. 267, Feb. 3, 1995; pp. 654-657; XP002419435.

Verhulst A S et al: "A rapid and precise probe for measurement of liquid xenon polarization"; Journal of Magnetic Resonance, Academic Press, Orlando, FL, US; vol. 155, No. 1, Mar. 2002; pp. 145-149; XP002206706.

Goodson BM: "Nuclear magnetic resonance of laser-polarized noble gases in molecules, materials and organisms"; Journal of Magnetic Resonance; vol. 155, 2002, pp. 157-216; XP004407831.

* cited by examiner

METHOD FOR ENHANCING THE NMR SIGNAL OF A LIQUID SOLUTION

CROSS REFERENCE TO RELATED APPLICATIONS

This application is a national stage application filed under 35 USC 371 of International Application No. PCT/FR2006/000109, filed Jan. 18, 2006, which claims priority from French patent application 05 00844 filed Jan. 27, 2005.

BACKGROUND OF THE INVENTION

The invention relates to a system and a method for performing NMR analysis in order to obtain an NMR signal from a liquid solution that is enhanced by comparison with the signal it would have had on the basis of thermodynamic equilibrium.

PRIOR ART

Nuclear magnetic resonance "NMR" is a spectroscopy technique which, particularly in the liquid phase, allows fine analysis of a substance. Its spectral resolution capability makes it possible, for example, to assign a resonance line to a nucleus or group of nuclei of a molecule. It is thus possible to determine or to verify the chemical composition of the medium.

In practice, this fine resolution is the result of the small amounts of energy involved, because the waves that cause the transitions are typically within a frequency band ranging from a few kilohertz to a few hundreds of megahertz. The energy $\Delta E$ of these transitions can be deduced from the Zeeman-Hamilton operator which corresponds to the interaction between the applied magnetic field $B_0$ and the nuclear magnetic moment, the gyromagnetic ratio of which is $\gamma$:

$$\Delta E = \gamma \hbar B_0 \quad (1)$$

where $\hbar$ is Planck's constant. In practice, the resonant frequency is equal to the precession frequency of the nuclear magnetic moments in the magnetic field $B_0$; this angular frequency is $\omega = \gamma B_0$. Through a misuse of language and in accordance with common usage in this field, we shall speak of $\omega$ as being a frequency. Likewise, since the gyromagnetic factor $\gamma$ is the proportionality factor relating the nuclear magnetic moment to the nuclear spin, the terms spin or magnetic moment will be used interchangeably. The resonant frequency of an isotope is, to within a few parts per million, a constant characterized by $\gamma$.

Currently, the amplitude of the permanent magnetic field $B_0$ created by the magnets means that the energies involved are below about $10^{-25}$ J. When this energy is compared with the thermal energy at ambient temperature (about $3 \times 10^{-21}$ J) it can be appreciated that nuclear magnetic resonance is not a sensitive spectroscopy technique. If, for the sake of simplicity, we consider a nucleus of spin $\frac{1}{2}$ with $n_\alpha$ and $n_\beta$ representing the populations of the $+\frac{1}{2}$ and $-\frac{1}{2}$ spin states respectively, a simple calculation shows that, at high temperatures, at thermodynamic equilibrium, the polarization P is given by:

$$P = \frac{n_\alpha - n_\beta}{n_\alpha + n_\beta} = \frac{\gamma \hbar B_0}{2kT} \quad (2)$$

where k is the Boltzmann constant and T is the temperature.

In NMR, the signal is proportional to the overall magnetization M which corresponds to the sum of the contributions of each nuclear magnetic moment:

$$M = \frac{1}{2}(n_\alpha + n_\beta) P \gamma \hbar \approx \frac{(n_\alpha + n_\beta)\gamma^2 \hbar^2 B_0}{4kT} \quad (3)$$

This magnetization is always weak at thermodynamic equilibrium and therefore the signal is weak, which means, for example, that recourse has to be had to highly concentrated samples.

Any method that will enable the magnetization to be improved will enhance the sensitivity of the NMR and therefore save time or improve the accuracy of the measurements or alternatively will open the way to studies involving smaller-sized samples.

Conventionally, the solution most widely used is to increase the strength of the magnetic field $B_0$. This solution is, however, technologically limited. On the one hand, the magnitude of the critical fields in known superconductors limits the amplitude of the field. This limit currently lies at around 30 T, while 21 T magnets are already being marketed. On the other hand, the use of resistive magnets suffers from spatial homogeneity and temporal stability problems. Hybrid technologies (using superconducting magnets+resistive magnets) are in the process of being validated, although the problems of spatial homogeneity and temporal stability resulting from the resistive component will still remain. These limits prevent high-resolution NMR applications being used for chemical analysis in liquids using this type of magnet.

Another solution, when it is the concentration rather than the quantity of sample that limits the sensitivity, is to increase the number ($n_\alpha + n_\beta$) of nuclear magnetic moments by increasing the useful volume in the NMR detection probe.

An alternative approach is to tackle this signal problem from the noise aspect. Reducing the electronic noise, particularly the noise produced by the probe and the amplifier that amplifies the detected signal, makes it possible to detect the NMR signal. The end-solution most currently used these days is to reduce the temperature of the coil to about 20 K and to reduce the temperature of the preamplifier to about 77 K.

Another solution which has proven to be rich in opportunities since it has practically no dependence on technical constraints, is to excite and detect only those spins having the highest gyromagnetic ratio. From the point of view of non-radioactive nuclei, this is the most abundant isotope of hydrogen, namely the proton $^1$H. In order to achieve a higher $\gamma$ it is necessary to consider the unpaired electrons. However, the frequency resolution in electron paramagnetic resonance is not that of NMR. Thus, this solution consists in using the long coherence times of an excited system of nuclear spins and the interactions between these magnetic moments in order to transfer the polarization from one type of nucleus to another. There are, in practice, three different approaches that can be taken in order to perform this transfer; two of them use bilinear interaction between the two types of spin, the time average of which is nonzero; these are therefore coherent transfers; the third using cross relaxation, that is to say random interactions of zero time average, and therefore a transfer of the incoherent type. This last approach is mainly known by the name of nuclear Overhauser effect (NOE) in which, at least in its initial implementations, the transfer principle is to use a radiofrequency field to irradiate one spin species and to observe the variations in intensity on the other spin species. It is thus possible, by saturating the $^1$H protons, to increase the polarization of the $^{13}$C by a factor of 4 over its thermodynamic value.

In the coherent transfer category, the first approach is to excite a first spin species A, and allow the magnetization thereof to evolve freely in the plane perpendicular to the magnetic field $B_0$. Because there is a bilinear interaction between A and the other spin species X, two-spin antiphase coherences of the $A_yX_z$ type will be created. Two pulses will enable these to be converted into two-spin transverse coherences of the $A_zX_y$ type on the nucleus X; these coherences, under the effect of the same bilinear interaction, can be detected. The magnetization detected on X, resulting from the initial polarization of A by the polarization transfer produces the same factor of 4 in the case of a pair of $^{13}$C—$^1$H spins. The transfer described is of the INEPT type; other implementations exist, again based on the concept of multiple excitations and free evolutions under the effect of bilinear interactions.

The other approach to effecting coherent transfer is to apply two continuous or composite irradiations in radiofrequency fields to A and X simultaneously, where the amplitude has been chosen with care. Under Hartmann-Hahn conditions, which are specified later on and which set the frequency and amplitude of the radiofrequency field irradiations, a transfer takes place which differs from the preceding transfer because it is characterized by an in-phase transfer, that is to say directly from $A_x$ to $X_x$. The gain in polarization is the same [see documents 1, 2 and 3].

Finally, there are two types of bilinear interaction that involve two different spins: scalar coupling which requires there to be chemical bonds between A and X and dipolar coupling which occurs through space. The latter is dependent upon the orientation of the internuclear vector with respect to $B_0$ and upon $1/r^3$, where r is the distance between the two nuclear spins. In the case of distances shorter than about 30 Å and in the liquid phase, Brownian motion makes the orientation of this vector somewhat random and this coupling cannot contribute to coherent evolution, but only to incoherent evolution in the form of dipolar relaxation. This aspect differentiates liquid-state NMR from solid-state NMR in which the dipolar coupling leads to coherent transfers. It is therefore accepted that, in the liquid phase, there is only one type of bilinear interaction between different spins, namely scalar coupling through the bonds.

However, again in the liquid phase and when the dipolar contributions from distant nuclei are taken into consideration, the dipolar interaction is no longer canceled out as a result of Brownian motion. The resulting dipolar contribution is, however, small because of the distance but is nevertheless not zero because all the spins in the sample make a contribution. In practice, the effect of this contribution can be detected only if the sample is highly concentrated and if the polarization, and therefore the magnetic field $B_0$, is strong. The dipolar coupling, felt by the protons in water and created by these same protons, is typically of the order of 1 Hz in a magnetic field of the order of 10 T. Because of this contribution, following excitation of the magnetization and free evolution, two-spin coherences involving two different molecules are created and can be detected. As this is a long-range effect, there is no reason why the two molecules have to be in the same container, and in practice, Warren et al. found coherences involving two molecules in different containers [see document 4]. All of these effects are known by the name of liquid-phase dipolar field effect.

Furthermore, various solutions have been proposed for preparing nuclear spin systems in which the populations of the +½ and −½ states differ widely from their thermodynamic values. The life of these highly polarized systems is dependent on many internal and external parameters but may be as much as several days to several months. This has given rise to the hope that the use of these highly polarized systems might become an alternative to the weak nuclear polarization inherent in NMR.

In order to create this strong nuclear polarization, the concept of polarization transfer is used, and a more highly polarized system needs to be employed. The weakness of the coupling between the nuclear spins and the other degrees of freedom of the system limits the number of solutions.

One first solution is to transfer the polarization from highly polarized electron spins. The gyromagnetic ratio of a free electron is, in fact, about 600 times higher than that of a proton. Dynamic nuclear polarization (DNP) exploits this method. It requires the presence of paramagnetic species and needs irradiation that affects the resonance of the unpaired electrons to be applied. Its use in high magnetic fields comes up against the difficulty of creating high-powered microwave frequency irradiation, against the problem of getting these microwaves to penetrate the substance and against the relative weakness of the electron polarization at ambient temperature. It is therefore a method that is chiefly attractive at low temperature. In addition, the spatial resolution observed in NMR often suffers from the presence of the paramagnetic centers. Nonetheless, one solution has recently been proposed and that is to use this technique to polarize a solid sample at low temperature (below 4 K), adding radicals and then very quickly heating it and dissolving it in a liquid so as to study its liquid-state NMR signal at ambient temperature.

A second solution is to use the degrees of freedom of rotation of a molecule in the gas phase and to quantify them. The use of para-hydrogen is one application of this which allows the signal to be enhanced when the $H_2$ molecule in its para state is added to a carbon-carbon double bond.

A third solution relies on optical pumping in order directly (metastable pumping of helium-3) or indirectly (spin exchange pumping) to create significant polarization of the nuclei. In practice, strong polarizations (higher than 0.01) can be achieved only if the longitudinal relaxation is not very efficient. This leads to the use of half spin rare gases, helium-3 or xenon-129.

In these latter instances (prepolarization of the sample using DNP, para-hydrogen induced polarization (PHIP) and laser-polarized rare gases), the polarization of the samples thus obtained can be maintained for several minutes to several hours and the sample can therefore be moved to a measurement locality. The sensitivity of NMR experiments using a sample that has been prepolarized by DNP, by PHIP, by laser-polarized helium-3 or laser-polarized xenon is therefore appreciably enhanced (by a factor of more than $10^3$) thereby. By contrast, only these isotopes are polarized, but the spins of the nuclei not directly involved in the polarization method find that their polarization is not directly affected. As a result, the ability to perform chemical analysis of any molecule is not appreciably improved.

At the present time, in the liquid phase, the only known way to use the strong polarization of these polarized gases with a view to increasing the sensitivity of proton NMR or NMR of any other nucleus is the SPINOE (spin polarization induced nuclear Overhauser effect) method described for example in patent U.S. Pat. No. 6,426,058. In this approach, the magnetization transfer is brought about by the cross dipolar relaxation between dissolved xenon and spatially proximate hydrogen nuclei. As it involves relaxation, this method is incoherent in nature.

Qualitatively, the way this method physically works is as follows. Xenon, which has been polarized by optical pumping, is dissolved in the solution that is to be studied. As the magnetic field $B_0$ is defined, equation (2) dictates that this means that the xenon spin temperature $T_{Xe}$ be very low, in absolute value. Initially the polarization of the protons at thermodynamic equilibrium defines their spin temperature as being equal to the temperature of the sample. The fact that xenon and protons are similar in size (a few ångströms) means that there is a dipolar coupling term connecting these two magnetizations. The time average of this coupling is, in fact, zero in the liquid phase because of Brownian motion. However, in time-dependent second-order perturbation theory, this dipolar coupling leads to a cross relaxation between these magnetizations which is dependent upon $1/r^6$ where r is the distance between the two nuclear spins. The very cold nature of the nuclear spins in xenon will therefore lead to a change in the proton spin temperature and therefore to a change in its polarization, and thus potentially to a gain in signal. The ability to lower the proton spin temperature will therefore be dependent upon the xenon-proton cross relaxation rate, upon the magnetization of the dissolved xenon compared with that of the protons and upon the direct rate of relaxation of xenon and that of the protons. The latter two factors in fact define the ability of xenon and protons to maintain or acquire spin temperatures different from that of the sample.

However, this approach requires the xenon to be very highly magnetized, and is effective in just two situations.

The first is the situation in which the longitudinal relaxation of the proton is very slow. In this situation, in spite of the low rate of xenon-proton cross relaxation, the final magnetization of the proton may differ very greatly from what it would be at thermodynamic equilibrium. This is what occurs, for example, in the case of deuterated benzene.

The second situation is the one in which the xenon has a special affinity for the molecule. Under these conditions, certain xenon-proton distances can be short and the affinity that the xenon has for this site is strong enough that effective transfers can be seen. This kind of situation is encountered in respect of molecules that have a hydrophobic cavity. The maximum gain in signal observed hitherto (a factor of 1.6 in an 11.7 T field) corresponds to a proton nuclear polarization of $6.4 \times 10^{-5}$.

The major disadvantage with this SPINOE method is the fact that the polarization transfer between the xenon and the proton works only when the nuclei are separated by extremely short distances of the order of 3 to 6 ångströms because of the $1/r^6$ dependency of the cross relaxation rates. Such conditions are so restrictive that they render any industrial application extremely difficult.

Finally, and for completeness, in the case of solid-state NMR applications there are two other approaches aimed at transferring the polarization from the xenon to other nuclei. In both cases the physical transfer process involves xenon adsorbed onto the surface of the solid and the nuclei of this same surface. Both use static dipolar interaction (of nonzero time average). The method consists in condensing polarized xenon onto the surface of the solid that is to be studied then in performing a polarization transfer either of the Hartmann-Hahn type between the xenon and the nuclei of the surface of the solid [see documents 5 and 6] or via thermal mixing. The latter consists in reducing the magnetic field $B_0$ to a value low enough for dipolar coupling between the xenon and the nuclei of the solid to be greater than the difference in resonant frequency between the two types of nuclei. In both cases, the transfer has a direct effect only on the nuclei at the surface of the solid.

SUBJECT AND SUMMARY OF THE INVENTION

The invention thus proposes to produce a system and a method for the NMR analysis of a liquid solution containing nuclei with nonzero nuclear spins, which alleviates the disadvantages of the prior art.

This object is achieved through the fact that the inventors have surprisingly discovered that if the spins of the nuclei of a polarization source and said spins of nuclei of said liquid solution are irradiated in such a way as to cause a polarization transfer of the Hartmann-Hahn type from the spins of the nuclei of said source to the spins of the nuclei of said liquid solution using coherent coupling resulting from the dipolar field created by the nuclei of the source, then the NMR signal obtained from said liquid solution is significantly enhanced over the value it would have had at thermodynamic equilibrium.

This dipolar field is a long-range field which is advantageously obtained using a strong concentration of polarization source nuclei (typically in excess of 0.01 mol/l) and/or strong nuclear polarization of the same nuclei (typically higher than 0.01).

Thus, the average dipolar field created by the polarization source makes it possible to have coherent coupling exerted from ranges of several millimeters, as opposed to the 3 to 6 ångströms in the incoherent coupling of the prior art, between the spins of said nuclei of the liquid solution and those of the polarization source.

Advantageously, said polarization source can be separated from said liquid solution by a distance that represents the effective range of said dipolar field, which is equal to or greater than 1 nanometer and which may range between 3 nanometers and 10 millimeters.

The use of this coupling in a liquid medium makes it possible to transfer the polarization from the source to said nuclei of the liquid solution without requiring the slightest special affinity between the atoms or molecules of the polarization source and those of said solution. The gain in polarization makes it possible to enhance the NMR signal of a sample of the liquid solution appreciably, thus allowing fine analysis of this sample.

In order to perform this polarization transfer of the Hartmann-Hahn type, a first irradiation in a radiofrequency field, the frequency of which is similar to (typically differing by less than 100 kHz from) the resonant frequency of said nuclei of the liquid solution in the magnetic field $B_0$ is applied at the same time as a second irradiation in a radiofrequency field, the frequency of which is similar to (typically differing by less than 100 kHz from) the resonant frequency of the nuclei of the polarization source. The form of these two irradiations can just as well be of constant amplitude, frequency and phase (continuous irradiation) as it can be of amplitude, frequency and phase all of which can vary during the period of irradiation (composite irradiation).

A polarization transfer of the Hartmann-Hahn type is generally described in the double rotating frame, that is to say whereby the two radiofrequency fields are independent of time. In the absence of any interaction between the spins, the nuclear magnetization then describes a precession perpendicular to the axis of the effective field in this rotating frame at a frequency dependent upon the amplitude of the irradiation. In order to make Hartmann-Hahn-type transfer possible, it is preferable that, within this frame, the difference in the precession frequencies of the spins of the polarization source and of the spins of said nuclei of the liquid solution resulting from the effect of the two irradiations in radiofrequency fields be less than ten times the amplitude of the dipolar field created by the nuclei of the polarization source and experienced by the spins of the nuclei of said solution. Conditions are at an optimum when this same distance is less than the amplitude of this average dipolar coupling. In addition, it is desirable to use a highly-concentrated and highly-polarized polarization source because the dipolar field created is more intense and the aforementioned conditions are therefore less drastic.

The greater the nuclear polarization ratio of the nuclei of the source and the more the nuclei of the source outnumber those of said solution, the greater will be the factor by which the polarization of the nuclei of said liquid solution is enhanced over the thermodynamic value.

The nuclei present in the liquid solution may be any nucleus that has a nonzero nuclear spin, particularly hydrogen nucleus isotope 1 (proton) or carbon nucleus isotope 13. It is, however, beneficial to perform the polarization transfer to nuclei in the solution that has a high gyromagnetic ratio because the dipolar coupling between the nuclei of the source and the nuclei of the solution is a linear function of the gyromagnetic ratio of the nuclei in the solution. In any event, it is always possible after this first transfer to perform a second transfer between these nuclei of said solution and other nuclei coupled thereto in a scalar manner, and for example to perform a $^1$H to $^{13}$C transfer. Let us, however, note that the factor by which polarization is enhanced using the method described in the present invention is greater, the weaker the initial polarization of said nuclei, that is to say the lower their gyromagnetic ratio.

Any effective method able to create a highly-polarized and/or highly-concentrated nuclear spin system can be used to prepare the polarization source. This source may, in particular, be obtained by adding para-hydrogen to a carbon-carbon double bond, or by prepolarizing a sample using the solid phase low temperature dynamic nuclear polarization method followed by dissolving the sample in a liquid. The polarization source may also consist of a rare gas polarized by optical pumping and chosen from the collection of the following gases: xenon, helium, neon, krypton and mixtures thereof. As xenon-129 and helium-3 are the only two spin ½ rare gases, it is desirable to use them because the levels of polarization that can be attained through optical pumping exceed 10%. In addition, the good solubility of xenon in certain organic solvents or its ability to become liquefied encourages a very strong xenon concentration able to create a strong dipolar field. Furthermore, the high gyromagnetic ratio of helium-3 (2.75 times that of xenon) and the very high levels of polarization obtained (up to 80%) are extremely beneficial in the use of this atom in the gaseous phase. Specifically, both the rate of increase of polarization of said nuclei in the solution and the dipolar coupling between these nuclei and the nuclei of the source are proportional to the gyromagnetic ratio of the nucleus of the polarization source. Thus, it is all the more beneficial to use a polarization force that uses a type of nucleus that has a very high gyromagnetic ratio.

The nuclei in the polarization source may be dissolved in said liquid solution or, on the other hand, may be physically separated from this same liquid solution. In the latter instance, the distance separating the polarization source from the liquid solution needs to be minimal so that the dipolar field created by the polarization source is at its maximum. It is preferable for this minimum distance to be less than 10 millimeters. The polarization source in this compartment, distinct from said liquid solution, may be in any physical state; the nuclei of the source may be dissolved in a liquid, or be in the form of a gas or even be condensed in a liquid solution. It is, however, beneficial, in order to have a high concentration and effective replenishment of the polarization source after the polarization transfer method described here has been applied, to use a compressed gaseous phase.

The two compartments, one of them intended to contain the liquid solution and the other to contain the polarization source, may be separated by a distance equal to or greater than 1 nanometer and preferably ranging between 3 nanometers and 10 millimeters.

The invention is also aimed at a system for performing an NMR analysis of a liquid solution containing nuclei with nonzero nuclear spins, the system comprising a magnet surrounding:

a polarization source, polarization transfer means designed to irradiate the spins of nuclei of said polarization source and said spins of the nuclei of said liquid solution, in such a way as to achieve a Hartmann-Hahn-type transfer of polarization from the spins of the nuclei of said source to the spins of the nuclei of said liquid solution by means of a coherent coupling resulting from the dipolar field created by the nuclei of the source so as to obtain an NMR signal from said liquid solution that is enhanced by comparison with the value it would have had at thermodynamic equilibrium.

The polarization means comprise:

a first irradiation means designed to subject the spins of the nuclei of said liquid solution to a first irradiation in radiofrequency fields of a continuous or composite type, and a second irradiation means designed to subject the spins of the nuclei of said polarization source to a second irradiation in radiofrequency fields of continuous or composite type.

According to one embodiment, the system comprises, inside said magnet, a tube containing said polarization source dissolved in said liquid solution.

According to another embodiment, the system comprises, inside said magnet, a container comprising two adjacent and mutually independent compartments which are intended, one of them to contain said polarization source and the other to contain said liquid solution.

According to yet another embodiment, the system comprises, inside said magnet, a container comprising two compartments, one internal and one external, said external compartment being intended to contain said polarization source and surrounding said internal compartment which is intended to contain said liquid solution.

BRIEF DESCRIPTION OF THE DRAWINGS

Other features and advantages of the present invention will become better apparent from reading the description of some particular embodiments, which is given with reference to the attached drawings in which.

DETAILED DESCRIPTION OF THE EMBODIMENTS

Figure 1:
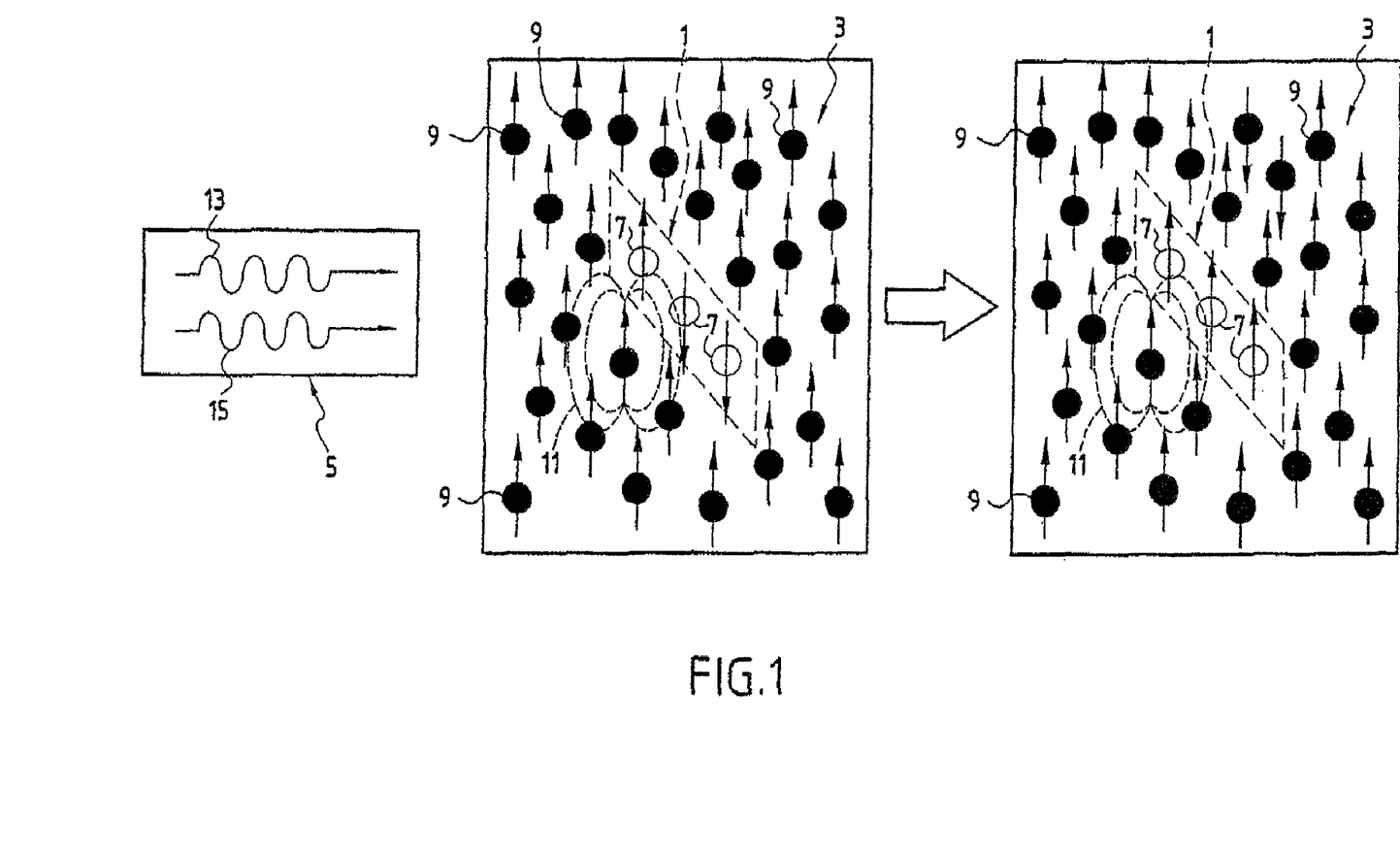
FIG. 1 very schematically illustrates a polarization system for enhancing the polarization of the nuclei of a liquid solution over its thermodynamic value, according to the invention.

According to the invention, FIG. 1 very schematically illustrates a polarization system for enhancing the nuclear polarization of the nuclei of a liquid solution 1 over its thermodynamic value. This enhances the NMR signal. This system comprises a polarization source 3, a sample of the liquid solution 1 that is to be studied and a polarization transfer means 5. It will be noted that the liquid solution 1 needs to have nuclei 7 that have a nonzero nuclear spin, for example nuclei of the $^1H$ hydrogen isotope, $^{13}C$ carbon isotope or the like.

Any polarization source which contains nuclei 9 that have highly polarized identical spins (P greater than 0.01) and that are highly concentrated (concentration c above 0.01 mol/l) are conceivable.

Thus, this polarization source 3 may consist of a rare gas that has been polarized by optical pumping and is chosen from the following collection of gases: xenon (Xe), helium (He), neon (Ne), krypton (Kr) or mixtures thereof. Advantageously, the polarization source 3 contains xenon (Xe-129) or helium (He-3) polarized by a laser or hyperpolarized, these being the only two spin ½ rare gases, and therefore gases in respect of which polarizations higher than 1% can be readily obtained. It will be noted that the polarization source 3 may also result from the addition of para-hydrogen to a carbon-carbon double bond or the prepolarization of a sample using the low temperature nuclear dynamic polarization process.

To simplify the description, in that which follows we shall consider a polarization source 3 containing laser-polarized xenon-129 (hereinafter termed xenon) 9 and a liquid solution 1 containing nuclei of hydrogen-1 isotope 7 (that is to say $^1H$ protons). In that which follows, in order to describe the physical processes involved in mathematical terms, we shall consider a system made up of N xenon nuclei $I^k$ and one proton S.

Thus, for any proton 7 in the solution 1, there is a dipolar interaction 11 between each xenon $I^k$ 9 and this proton 7. The Hamilton operator which describes this interaction is:

$$H_{kS} = -\frac{\mu_0}{4\pi} \frac{\gamma_H \gamma_{Xe} \hbar}{r_{kS}^3} f(\theta, \varphi) I_z^k S_z \quad (4)$$

where $\mu_0$ is the magnetic permeability of vacuum ($\mu_0 = 4\pi 10^{-7}$ S.I.), $f(\theta, \varphi)$ is a function dependent on the orientation ($\theta, \varphi$) of the internuclear vector $\overline{I^k S}$ with respect to the axis of the magnetic field $B_0$. However, because of Brownian motion in the liquid phase, the orientation of the internuclear vector varies. That means that this dipolar interaction averages out to zero. Hence, this interaction contributes only through the relaxation (the effect on the width of the resonance line). However, in order for the Brownian motion to be effective in averaging out this interaction, the internuclear vector between the xenon 9 and the proton 7 needs to be capable of adopting all directions in space. The relative diffusion of the xenon 9 and of the molecule bearing the proton 7 ($^1H$) during the acquisition time therefore defines a sphere around the proton 7 within which sphere the average of the intermolecular dipolar interaction is zero. There therefore remains a contribution from distant xenon atoms 9. The dipolar contribution from a distant xenon atom is dependent on the distance r between the xenon 9 and the proton and decays with ($1/r^3$). The contribution experienced by the proton S is in fact the sum of all the individual contributions of each xenon:

$$H = -\frac{\mu_0}{4\pi} \gamma_H \gamma_{Xe} \hbar \sum_k \langle \frac{f(\theta, \varphi)}{r_{kS}^3} \rangle I_z^k S_z \quad (5)$$

In practice, since the xenon concentration is high it is possible to adopt a continuous model and replace the discrete sum with an integration over the entire volume of the sample; their compensates for the decay in ($1/r^3$) of the dipolar contribution. Two types of phenomenon may then arise. In the first, we are interested only in the proton and we can therefore factor into equation (5) the contributions of each xenon and ultimately adopt the average value of the $I^k$. From the point of view of the proton S, this all amounts to there being an additional magnetic field contribution parallel to $B_0$. This additional magnetic field B is created by all of the xenon atoms together and is experienced by the proton. The other type of phenomenon occurs when the protons and the xenons are excited simultaneously. When this happens, the same equation (5) shows that there is coupling between the two spin systems. The existence of this average dipolar coupling (equation 5) implies that there is coupling between the nuclear spin system of the proton 7 and the spin system of the xenon 9. This coupling is now coherent because it directly influences, for example, the resonant frequency of the protons 7 through the field B rather than mainly their line width.

In fact, the greater the amount of xenon 9 and the greater the polarization of this xenon 9, the more significant this dipolar contribution will be. This phenomenon is described as the dipolar field created by the entire polarization source 3 on the protons 9. This dipolar field is dependent upon the geometry of the container of the polarization source 3. The value of this magnetic field created by this magnetizing of the xenon 9 via the dipolar interaction is:

$$B = -\frac{2\mu_0}{3} \xi M_{Xe} \quad (6)$$

where $M_{Xe}$ is the magnetization of the xenon 9 per unit volume. This is expressed as:

$$M_{Xe} = 1000 \, cNP \frac{\gamma_{Xe} \hbar}{2} \quad (7)$$

where c is the concentration of the xenon 9 in mol/l$^{-1}$, N is Avogadro's number and $-\frac{1}{2} \leq \zeta \leq 1$ is a factor dependent on the geometry of the sample, and which has, for example, been fully tabulated for samples of ellipsoidal shape.

Under the polarization and concentration conditions described in the invention, the magnetization associated with this xenon 9 is very strong, several times that of the protons 7 of water placed in a 14 T magnetic field at ambient temperature. The field B (equation 6) may actually be of the order of several $10^{-7}$ T.

However, since the Hamilton operator associated with this dipolar coupling (equation 5) between the spin systems of the polarization source 3 (xenons) and of the liquid solution 1 (protons) switches with the Zeeman-Hamilton operator, it is necessary to resort to a sequence of pulses to ensure that, as a result of this coupling, the magnetization of the protons 7 and that of the xenon 9 are very closely linked and polarization transfer can take place. This is achieved in the invention by means of a coherence transfer of the Hartmann-Hahn type [see document 1].

Thus, according to the invention, a polarization transfer of the Hartmann-Hahn type is performed between the polarization source 3 (xenon) and the nuclei 7 (protons) of the liquid solution 1 via the coherent coupling resulting from the long-range dipolar field created by the polarization source 3 and experienced by the protons.

Specifically, the polarization transfer means 5 comprises a first irradiation means (for example obtained using a first coil) and a second irradiation means (for example obtained using a second coil). The first irradiation means generates a first irradiation 13 that is continuous or composite in a radiofrequency field of amplitude $\omega_1^s/\gamma_s$ and of which the frequency $\omega_0^s/2\pi$, more commonly termed $\omega_0^s$, is close to the resonant frequency $\omega_s$ of the spins of the nuclei 7 in the magnetic field $B_0$ and the second irradiation means generates a second continuous or composite irradiation 15 in a radiofrequency field of amplitude $\omega_1^1/\gamma_1$ and of which the frequency $\omega_0^1/2\pi$, more commonly termed $\omega_0^1$, is close to the resonant frequency $\omega_1$ of the spins of the nuclei 9 of the polarization source 3 in the magnetic field $B_0$. It is preferable for the differences $|\omega_0^s - \omega_s|$ and $|\omega_0^1 - \omega_1|$ to remain less than $10^6$ rad.s$^{-1}$ respectively and preferable for them to be below 10 $\omega_1^s$ and 10 $\omega_1^1$, respectively. Thus, the polarization transfer is performed by applying the continuous or composite first irradiation 13 in a radiofrequency field to the spins of the nuclei 7 of the liquid solution 1 and by applying the continuous or composite second irradiation 15 in a radiofrequency field to the spins of the nuclei 9 of the polarization source 3.

In order to make sure that the dipolar interaction does not switch with the Zeeman-Hamilton operator, it is advantageous for the first and second irradiations 13 and 15 to exhibit a mutual difference in amplitude $|\omega_1^1 - \omega_1^s|$ of less than 10 times the amplitude of the dipolar coupling $\delta$ between the spins of the nuclei of the polarization source 3 and those of the liquid solution 1:

$$d = -\gamma_H B = \frac{\mu_0}{3} 1000 \xi c N P \gamma_{Xe} \hbar \gamma_H \qquad (8)$$

By way of example, the first and second irradiations 13 and 15 may differ in amplitude from one another by less than one times the amplitude of the dipolar field created by the polarization source 3 and experienced by the spins of the nuclei 7 of the liquid solution 1.

Specifically, continuous irradiations 13, 15 or series of composite pulses affecting protons 7 of the liquid solution 1 and xenons 9 of the polarization source 3 mean that the effective fields in the double rotating frame and felt by the xenons 9 and the proton 7 (frame rotating at $\omega_0^1$ in the case of the proton 7 and rotating at $\omega_0^s$ in the case of the xenon 9) best coincide; the scale being the dipolar coupling $\delta$ between the xenon 9 and the proton 7.

Thus, under these conditions, the dipolar interaction no longer switches with these Zeeman-Hamilton operators:

$$\tilde{H} = \sqrt{\omega_1^{l2} + (\omega_0^l - \omega_1)^2} \sum_k I_Z^k + \sqrt{\omega_1^{s2} + (\omega_0^s - \omega_S)^2} S_Z \qquad (9)$$

in the double rotating frame with the axes OZ aligned with the effective fields. The system therefore evolves under the effect of the dipolar coupling $\delta$.

Furthermore, given that the polarization source 3 contains a great many xenon atoms 9, a statistical process emerges and means that the spin temperatures of the xenon 9 and of the protons 7 which have recoupled in the rotating frame will converge toward the same value. This results in a cooling of the spin system of the protons 7 and therefore in an increase in the polarization thereof and therefore in their magnetization, which is therefore accompanied by a gain in signal.

In fact, the conditions defined here correspond to an extension of the Hartmann-Hahn conditions [see document 1]. These conditions are actually: $|\omega_0^s = \omega^s|$, $|\omega_0^1 = \omega^1|$ and $|\omega_1^1 = \omega_1^s|$. They correspond to the cases of continuous irradiation.

Thus, the invention consists in transferring polarization from the xenon to the protons using the dipolar coupling there is between these. To do that, it is therefore necessary to contrive to obtain an effective Hamilton operator in the double rotating frame which is dipolar coupling. Since, in fact, the portion of interest is the type $I_z S_z$ portion of this interaction (equation 5), the dipolar recoupling conditions are in fact similar to those required for performing a transfer of magnetization of the heteronuclear Hartmann-Hahn type where it is the interactions through the chemical bonds that provide the coupling between the two baths. This last scenario has been the subject of many studies [see document 3]. The major differences between these two types of transfer are the amplitude of the coupling which here is far weaker than the scalar coupling encountered in an NH or CH pair (in excess of 90 Hz) and its highly non localized nature, since all the xenons have to be taken into consideration. Through the similarity in form of the coupling Hamilton operator, all the Hartmann-Hahn transfer sequences that use composite irradiations can be employed.

Sequences of the WALTZ-16, MLEV-16, WALTZ-8, DIPSI-2, DIPSI-2-+-, MLEV-17, SHR-1, MGS-1, MGS-2 type or even sequences based on adiabatic pulses may thus be used to good effect [see document 3]. However, it will be observed that all the composite or multi-pulsed sequences in which there is no effective field are less effective than those which have an effective field. That is because in the former instance, the contribution of the dipolar energy will not be insignificant, because the effect of imperfections in the pulses in creating the effective Hamilton operator will very quickly become significant by comparison with $\delta$ and finally because, for heteronuclear coupling, an isotropic transfer is 50% slower than a transfer using an effective field [see document 3]. The major benefit of using these sequences of multiple pulses is their ability to tolerate the effects associated with the discrepancy between the frequency of their radiation 13, which is $\omega_0^1$ (or $\omega_0^s$ in the case of the irradiation 15) and the resonant frequency of the spin 7, which is $\omega^1$ (or $\omega^s$ in the case of the spin 9). This offers the ability to polarize all the protons of a molecule simultaneously.

Thus, the principle of the invention is to use a highly polarized and highly concentrated source 3 in order to have strong dipolar coupling between the spins of the nuclei 7 and 9. This, by virtue of irradiations under Hartmann-Hahn conditions, makes it possible to lower the spin temperature of the irradiated nuclei 7. Under these conditions, it is clear that this method can be applied to any type of nuclear spin whatsoever. The major difference according to the isotope used will be the efficiency of the transfer and therefore the extent to which the signal obtained is enhanced. Indeed, dipolar coupling $\delta$ (equation 8) is proportional to the gyromagnetic ratio of the nucleus 7 to which transfer is made (for example the proton). In consequence, this coupling is, for example, four times weaker if the transfer is to $^{13}C$ rather than to $^1H$. Likewise, recourse to paramagnetic systems or to quadrupole nuclei is possible.

Still according to the expression of $\delta$, it is clearly evident that, for the same concentration c and polarization P in a polarized nuclear system, the gyromagnetic ratio of this polarized isotope becomes the most significant factor when increasing $\delta$ and therefore facilitating the obtaining of Hartmann-Hahn conditions so as to increase the transfer rate and ultimately increase the signal gain. Thus, helium $^3He$ becomes especially beneficial because its gyromagnetic ratio is 2.75 times higher than that of xenon-129.

Let us finally note that, in this method, there is nothing to dictate that the polarization source 3 (for example the xenon) and the liquid solution 1 (for example containing the proton) have to be closely mixed, because what causes the transfer is the coupling between the two spin systems which is brought about by the strong magnetization of the source which creates the average dipolar field which is itself experienced by the spins of the liquid solution 1. It is therefore possible to conceive of compartmentalizing the polarization source 3 and the liquid solution 1 that is to be studied.

Indeed, the transfer principle involves using the dipolar field created by the source 3 of polarized nuclear spins in order to create coupling between the spin system of the source 3 and that of another species 7 (contained in the liquid solution) and thus succeed in transferring polarization. In practical terms, this dipolar field exists not only within the volume containing the polarization source 3 but extends to the outside simply as a result of the laws of magnetostatic theory. As a result, the system of polarized nuclear spins 7 (xenon-129, helium-3 or the like) can be in a different compartment from the sample containing the liquid solution that is to be studied 1.

Figure 2A:
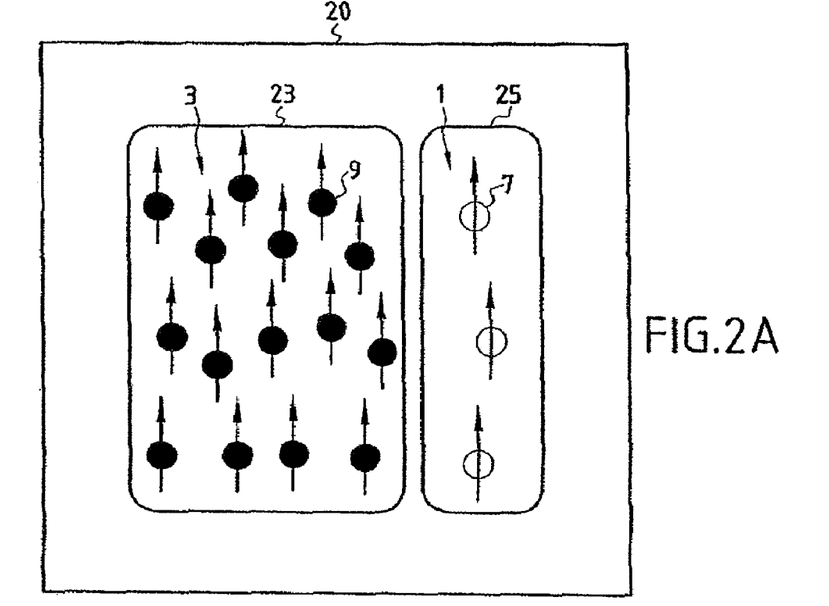
FIGS. 2A and 2B very schematically show two examples of polarization systems of FIG. 1 with a polarization source physically separated from the liquid solution.
Figure 2B:
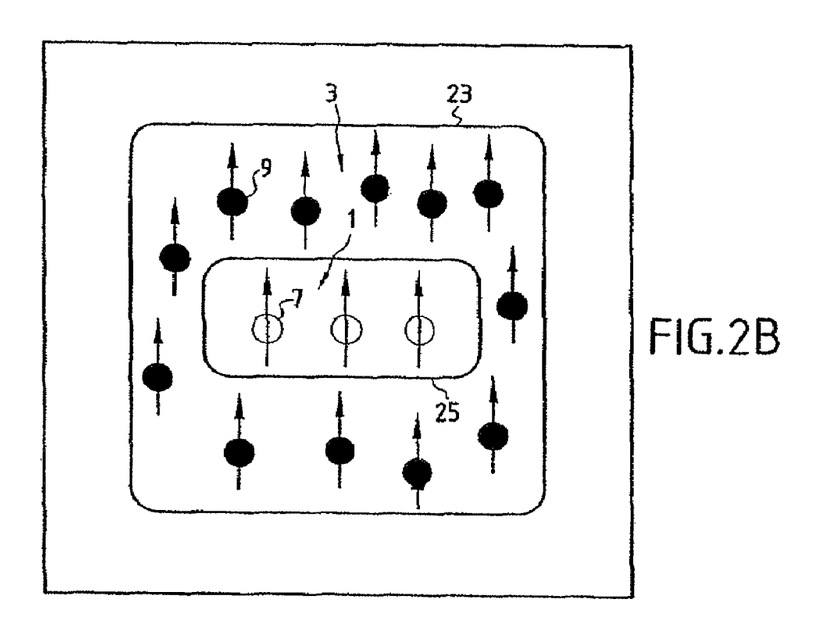

Specifically, FIGS. 2A and 2B very schematically show that the polarization source 3 can be physically separated from the liquid solution 1. Advantageously, the distance separating the polarization source 3 from the liquid solution 1 may correspond to a few nanometers and preferably be less than ten millimeters. However, because of this separation the dipolar field $\delta$ will decrease, the factor $\zeta$ (equation 8) tending toward zero for the two samples as a function of the inverse of the cube of the distance separating them. Thus, it is advantageous in the present state of the art to optimize the geometry and not exceed a separation of 10 millimeters.

Thus, the polarization system according to the invention may comprise a container 20 comprising a first compartment 23 containing the polarization source 3 and a second compartment 25 containing the liquid solution 1. By way of example, the first and second compartments 23, 25 may be two separate capillary tubes, which is a geometry which, for example, allowed W. S. Warren et al. to observe multiple intermolecular coherences obtained through the dipolar field effect [see document 4].

For example, FIG. 2B shows that the first compartment 23 may be positioned around the second compartment 25. By way of example, a sample of the liquid solution 1 may be placed in a small central tube and the polarization source 3 may be placed in a second tube surrounding the first tube.

In what follows, in order to have an expression for the signal gain of a proton in a liquid solution, we shall consider a model made up of N xenon atoms $I^k$ and one proton S. Thus, at thermal equilibrium, the density matrix is given by:

$$\sigma_{th} = \frac{\exp - \beta_L H}{Tr(\exp - \beta_L H)} \tag{10}$$

$$\approx \frac{1 - \beta_L H}{2^{N+1}}$$

$$= \frac{1}{2^{N+1}}\left(1 - \sum_k \beta_L \omega_1 I_z^k - \beta_L \omega_S S_2\right)$$

where Tr(A) corresponds to the trace of the operator A, $\beta_L = \hbar/kT$ is the inverse temperature of the system and where weak polarization at this temperature T is accepted. H corresponds to the Zeeman-Hamiltonian operator in the field $B_0$ considered:

$$H = \omega_1 \sum_k I_z^k + \omega_S S_x \tag{11}$$

Under these conditions, the signal from the xenon after a 90° pulse along an axis Oy (which transforms $\sigma_{th}$ to $\sigma'_{th}$) is proportional to:

$$\langle I_x \rangle = Tr\left(\sigma'_{th}\sum_k I_x^k\right) \approx -\frac{\beta_L \omega_1}{2^{N+1}}\sum_{k,l} Tr(I_x^k I_x^l) = -\frac{N\beta_L \omega_1}{4} \tag{12}$$

When the xenon is polarized by optical pumping, the xenon spin density matrix is:

$$\sigma_{pol} = \frac{\exp - \beta_{pol} H_{Xe}}{2Tr(\exp - \beta_{pol} H_{Xe})} \tag{13}$$

$$= \frac{1}{2^{N+1}\cosh\left(\frac{\beta_{pol}\omega_1}{2}\right)}$$

$$\left(\cosh\frac{\beta_{pol}\omega_1}{2} 1 - 2\sinh\frac{\beta_{pol}\omega_1}{2}\sum_k I_z^k + \text{multi-spin terms}\right)$$

From this, we can therefore deduce the polarized xenon signal:

$$\langle I_x \rangle = Tr\left(\sigma'_{pol}\sum_k I_x^k\right) = -\frac{N}{2}\tanh\frac{\beta_{pol}\omega_1}{2} \tag{14}$$

where $\sigma'_{pol}$ is the density matrix after the 90° pulse along Oy. If the measured signal gain factor is denoted $K_{Xe}$, the inverse spin temperature of the polarized xenon can be deduced:

$$\beta_L \omega_1 K_{Xe} = 2\tanh\frac{\beta_{pol}\omega_1}{2} \tag{15}$$

It will be noted that throughout the Hartmann-Hahn transfer and for a short period of time (typically representing a factor of 0.3 at most) by comparison with the relaxation time along a "spin lock" field ($T_{1\rho}$), the energy of the spin system is constant. However, because of the dipolar coupling, the spin systems or spin baths of the xenon and of the proton will tend toward the same temperature in the double rotating field. By accepting that the irradiations are applied in this frame at resonance $|\omega_0^1 - \omega_1| = |\omega_0^s - \omega_s| = 0$, the Zeeman-Hamilton operator $\hat{H} = \omega_1^1 \Sigma_k I_z^k + \omega_1^s S_z$ is assumed to be large by comparison with the dipolar interaction which means that the contribution of dipolar energy is negligible. Thus, the energy is given by the following formula:

$$\langle H \rangle = Tr\left(\sigma_i\left(\omega_1^I \sum_k I_Z^k + \omega_1^S S_Z\right)\right) = Tr\left(\sigma_f\left(\omega_1^I \sum_k I_Z^k + \omega_1^S S_Z\right)\right) \tag{16}$$

where $\sigma_i$ and $\sigma_f$ are the density matrices at the start and end of irradiation. By using equation (13) and using $\beta'_{pol}$ to denote the inverse spin temperature of the xenon defined with respect to the amplitude of the radiofrequency field ($\omega_1^1$), it is possible to deduce the energy at the start:

$$\langle H \rangle = Tr\left(\sigma_i\left(\omega_1^I \sum_k I_Z^k + \omega_1^S S_Z\right)\right) = -\frac{N}{2}\tanh\frac{\beta'_{pol}\omega_1^I}{2} \tag{17}$$

The value of $\beta'_{pol}$ is calculated below using the conservation of energy:

$$\beta'_{pol} = \frac{\omega_1}{\omega_1^I}\beta_{pol} \tag{18}$$

At the end of spin lock, the energy calculation shows, according to the spin temperature model, that:

$$\langle H \rangle = Tr\left(\sigma_f\left(\omega_1^I \sum_k I_Z^k + \omega_1^S S_Z\right)\right) = -\frac{N+1}{2}\tanh\frac{\beta'_f \omega_1^I}{2} \tag{19}$$

where the Hartmann-Hahn condition $\omega_1^I = \omega_1^s$ has been used, and where $\beta'_f$ is the inverse spin temperature in the rotating fields in the steady state. This can be used to deduce the inverse spin temperature:

$$\tanh\frac{\beta'_f \omega_1^I}{2} = \frac{N}{N+1}\tanh\frac{\beta_{pol}\omega_1}{2} \tag{20}$$

Thus, in the laboratory frame, when the radiofrequency irradiations are stopped and the changes in magnetization of the xenon and of the proton are therefore decorrelated:

$$\tanh\frac{\beta_f \omega_S}{2} = \frac{N}{N+1}\tanh\frac{\beta_{pol}\omega_1}{2} \tag{21}$$

This can therefore be used to deduce the expected proton signal gain $K_H$:

$$K_H = \frac{\sinh(\beta_f \omega_S / 2)}{\beta_L \omega_S / 2} = \frac{\gamma_{Xe}}{\gamma_{11}}\frac{N}{N+1} K_{Xe} \tag{22}$$

The above calculation is performed for one proton and N xenons. By immediate extension for the case of a dilute system of protons 7, N can be considered to be the ratio the xenon concentration to the proton concentration. According to equation (22), the polarization transfer will be effective if the magnetization of the xenon, through its number N of atoms (by comparison with the number of protons) and its level of polarization $K_{Xe}$ is very high by comparison with that of the proton. The polarizations achieved for xenon can be as high as 70%, namely $K_{Xe} \approx 50\,000$ for an 11.7 T magnetic field $B_0$, so the expected signal gain for the protons can be as high as $K_H \approx 12\,000$ when the ratio N between the number of xenon atoms and the number of proton atoms is large by comparison with 1. Equation (22) immediately shows, that under these same conditions, $K_H$ reaches the order of 6000 if there are as many xenons as there are protons, and rapidly tends toward 0 if there are more protons than there are xenons. The proposed solution is therefore particularly useful for weakly concentrated samples. Obviously, by using helium-3 instead of xenon-129 it will be possible to enjoy a higher level of polarization (up to 80%) and especially a higher gyromagnetic ratio, and the signal gain will therefore also be improved. Let us, however, note that for industrial embodiments in which the polarized gas is dissolved in the liquid solution, the poor solubility of helium by comparison with that of xenon makes it difficult to obtain very strong specific magnetization. This restriction disappears when the transfer is performed from polarized gas present in a compartment separate from the one containing the liquid solution (see FIG. 2A).

However, it is important to point out that the above calculation is a thermodynamic calculation which defines the level of enhancement of the signal of a proton for a time that is relatively long by comparison with the transfer time but short (a factor of 0.3 at most) by comparison with the relaxation times $T_{1\rho}$ in the rotating frame. In fact, for an interaction-free model, the relaxation time of xenon in the rotating frame needs to be of the order of the longitudinal relaxation time $T_1$ of xenon and therefore of the order of several minutes. By contrast, between $T_{1\rho}$ for the protons and the inverse of the dipolar coupling $1/\delta$, it is impossible to resolve their relative values. The maximum proton signal gain will therefore be reached only if the polarization transfer rate characterized by the dipolar coupling $\delta$ is large by comparison with the relaxation along the effective field $1/T_{1\rho}$. Finally, the level of enhancement in signal $K_H$ observed is dependent on numerous factors or constraints, such as the quality with which the Hartmann-Hahn conditions are set, the inhomogeneity of the radiofrequency fields, the precision in the irradiation frequencies, and the type of continuous or composite irradiations used in order to allow the dipolar coupling to take effect.

As far as implementing this approach is concerned, because of the way in which the polarization of the proton is prepared it is general and can therefore, advantageously once $K_H$ exceeds 1, replace the delay in returning to thermodynamic equilibrium which precedes any sequence of pulses. In practical terms, it can be combined with any approach able to increase the polarization and therefore the signal of a dilute spin system. It is thus possible to combine a return to thermodynamic equilibrium followed by a polarization transfer using the method described here in order also to enjoy thermal polarization. It is even possible, following this polarization transfer, to supplement this with a second transfer using the scalar coupling between nuclei of one and the same molecule in order to polarize these nuclei. The benefit of such an approach if considering, for example, a $^{15}$N—H system, lies in the more effective transfer in the case of xenon to the proton ($\gamma_N/\gamma_H$=0.1) resulting from a higher $\delta$, and the good efficiency of the INEPT-transfers from the proton to nitrogen-15. Let us finally note that the use of composite sequences for the Hartmann-Hahn transfer opens the way to improving the polarization of all the protons at once. From an industrial implementation standpoint, since the polarization transfer on the one hand and the relaxation on the other hand will lead to a reduction in the polarization of the xenon, it is necessary to anticipate renewing part of the polarization source between transfers so as to achieve a steady state, thus opening the way to use of this method combined with any one-dimensional, two-dimensional, three-dimensional or more liquid-state NMR sequence.

In the present state of the art, a transfer such as this is conceivable only if the dipolar coupling $\delta$ between the nuclei of the polarization source and those of the solution is greater than 0.1 Hz. It is, however, preferable for it to be higher than 1 Hz.

Reference will now be made to FIGS. 3 to 8 which illustrate one example according to the invention for enhancing an NMR signal of a liquid solution over that obtained from thermodynamic equilibrium, using strongly polarized xenon.

Figure 3:
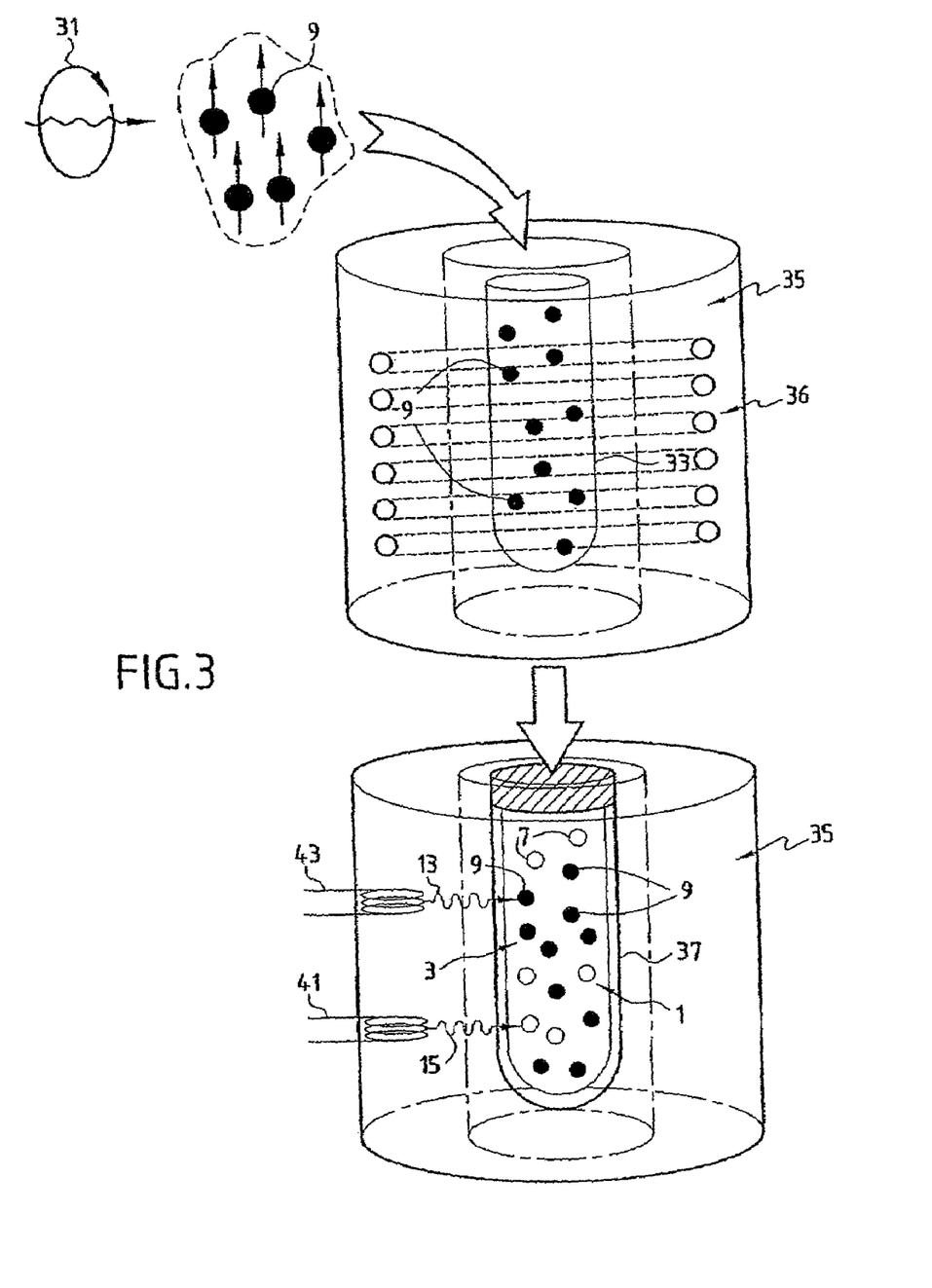
FIG. 3 very schematically illustrates one embodiment of the system of FIG. 1.

The experimental choices which have been taken in order to make it possible to achieve the results set out here are based on the technical constraints of the equipment used, which is designed to polarize a small amount of xenon-129. Specifically, according to the invention, it is preferable for the two radiofrequency fields 13, 15 applied to the proton 7 and xenon 9 channels to be identical to within d so that transfer can occur effectively. As a result, the ability to employ this polarization transfer method is dependent upon the magnitude of the dipolar coupling d. These constraints are particularly tight since, given the equipment used, the irradiations 13 and 15 are created by two distinct coils and are therefore created under conditions in which the effects of inhomogeneity of the radiofrequency fields are at their maximum. In addition, a Hartmann-Hahn-type transfer has never been described using such a weak scalar coupling between two spin species [see document 3]. By way of comparison, scalar couplings through the bonds which, in liquid phase, provide this type of transfer between the spins of different isotopes generally exceed 90 Hz. It is therefore essential to maximize the dipolar coupling $\delta$, that is to say the polarization of the nuclei of the source and the concentration thereof. This is because the choice of polarization source is set by the equipment and it is not possible, by choosing another nucleus, to alter the gyromagnetic ratio $\gamma_1$. The choices made therefore consisted in maximizing the product cP by increasing the amount of xenon in the optical pumping cell (but not excessively, as to do so would have a detrimental effect on P), using $^{129}$Xe-enriched xenon, minimizing the volume of the sample and using a solvent in which the solubility of xenon is very great.

Specifically, in order to attain the conditions required to allow a Hartmann-Hahn-type polarization transfer, use is preferably made of $^{129}$Xe-enriched xenon (containing more than 96% of $^{129}$Xe) and conditions that ensure good production of polarized gas. By way of example, it is possible to use xenon partial pressures in excess of 40 torr during optical pumping in order to maximize the amount of polarized xenon and therefore the magnetization of the xenon.

FIG. 3 very schematically illustrates that, after optical pumping 31, the xenon 9 is condensed in a tube 33 immersed in a liquid-nitrogen-cooled solenoid 35. The xenon 9 contained in this tube 33 is therefore heated in the leakage field of the superconductor magnet 36 of the NMR spectrometer. It is then condensed in a tube 37 containing the liquid test solution 1, this tube 37 having been degassed beforehand. In order to maximize the magnetization per unit volume which in fact defines the amplitude of the dipolar coupling between the two spin systems, it is preferable to use a shortened thick-walled NMR tube 37, for example a tube 37 with an outside diameter of 5 mm, a wall thickness of 1.4 mm and an overall length of 150 mm.

To begin with, the tube 37 contains a solution of 3,3-diethoxy-1-propyne dissolved in deuterated (99%) cyclohexane prepared at ambient temperature. Typically, the pressure inside this tube 37 just after the addition of the polarization source 3 (that is to say the gaseous xenon 9) is of the order of eight atmospheres. The tube 37 is then profusely agitated in order to dissolve the xenon 9, then placed back inside the magnet 36 of the NMR spectrometer.

By way of example, the NMR spectrometer may be of the Bruker DRX500 type equipped with a Bruker broadband inverse probe. In this case, the $^1$H channel and the xenon-129 (hereinafter termed xenon) channel use two different coils 41 and 43 respectively. There is therefore no correlation in the inhomogeneities of the radiofrequency fields created by these two coils 41 and 43. The first coil generates the first irradiation 13 on the proton nuclei 7 and the second coil generates the second irradiation 15 on the xenon nuclei 9.

It will be noted that the fact that there is strong magnetization of the laser-polarized xenon 9 per unit volume causes a frequency shift (equation 8) of the proton 7 in this tube 37 (considered to be an infinite cylinder) as expressed by the following equation:

$$d = -\frac{\mu_0}{6}1000cNP\gamma_{Xe}\hbar\gamma_H = +41,83cP \text{ Hz} \tag{23}$$

In this example we can expect a shift of 6.3 Hz for a xenon concentration of 1 mol/l$^{-1}$ and a polarization of 15%.

Figure 4:
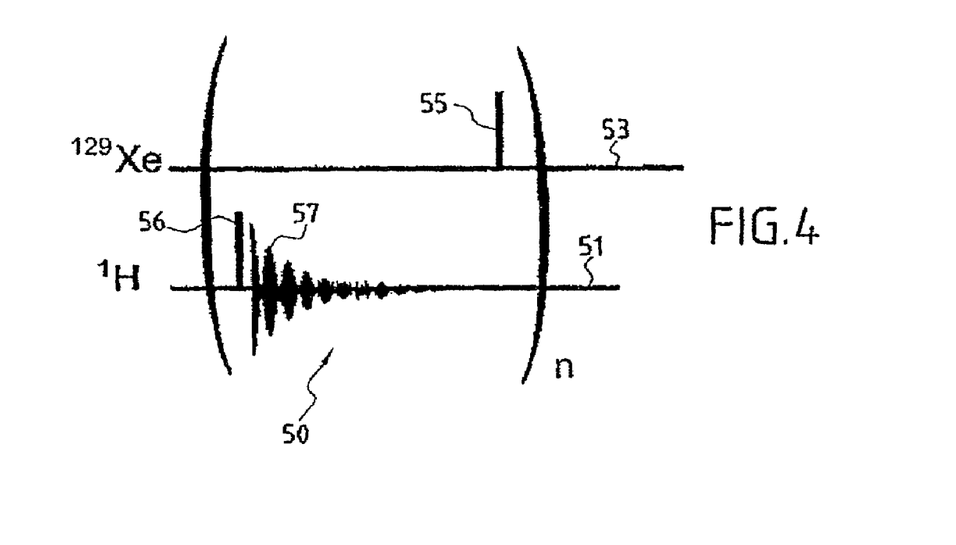
FIG. 4 shows a sequence of pulses affecting the spins of the nuclei of the polarization source and of the liquid solution which is used, showing the existence of the coupling between these two types of nuclei, according to the invention.

Hence, FIG. 4 shows a sequence 50 of pulses using the proton H channel 51 and the xenon channel 53. This sequence 50 is used to measure the dipolar coupling between the xenon 9 and the protons 7. Thus, a series of n proton spectra 57 is acquired. Each spectrum 57 is acquired following excitation of the magnetization of the protons by a pulse 56 on the proton channel 51. Once each spectrum has been acquired, a pulse 55 at angle $\theta$ is applied to the xenon channel 53 to reduce the magnetization of the xenon by a factor cos $\theta$.

Once the xenon 9 has been added, the NMR tube 37 has been placed in the magnet 36 of the NMR spectrometer and the spatial homogeneity of the magnet has been optimized by deuterium resonance, any field locking is eliminated so that there is no compensation for the modification of the magnetization of the xenon 9.

Next, a series of one-dimensional spectra on the proton channel following the sequence of pulses 50 is recorded, effecting a pulse 55 at angle $\theta$ (<90°) on the xenon channel 53 between acquisitions. It will be noted that a variation in the resonant frequency of each of the proton peaks (identical variation for all) is obtained through the series of spectra. In parallel with this, a variation in the intensity of the proton signal 57 is observed. This is the result of the combined action of an excessively short recovery time between each proton acquisition and of the variable SPINOE effect that follows from the reduction in the magnetization of the xenon. It is thanks to this effect that the sign of the polarization of the xenon can be determined absolutely.

Figure 5:
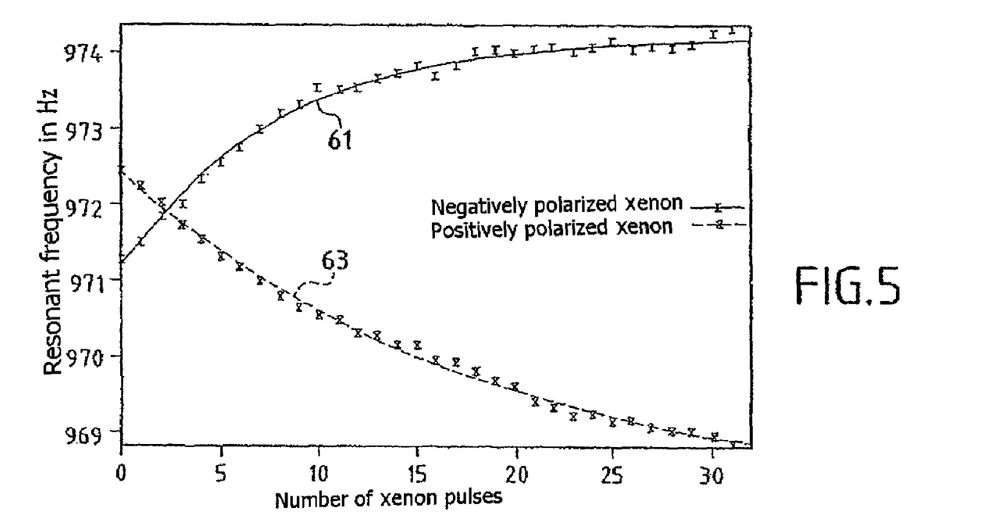
FIG. 5 illustrates the variation in resonant frequency of the protons of the solution as a function of the number of pulses applied to the xenon nuclei, so as to determine the amplitude of the dipolar coupling, according to the invention.

In effect, FIG. 5 illustrates the variation in resonant frequency of the protons as a function of the number of pulses applied to the xenon. The dipolar coupling determined is equal to −3.05±0.05 Hz for negative polarization 61 of the xenon and 4.32±0.10 Hz for positive polarization 63, respectively.

An estimate of the product cP (see equation 23) can be deduced from the adjusted ($\delta \cos^{n-1}\theta+B$) curve where $\delta$ is the initial frequency shift resulting from the dipolar coupling, $\theta$ is the xenon pulse angle, n is the number of the proton spectrum and B is the proton resonant frequency limit value.

By comparing the laser-polarized xenon signal with the signal from xenon at thermodynamic equilibrium, it is possible to deduce that, in this example, the polarization of the dissolved xenon is 9.6%.

By way of example and in order to illustrate the existence of a dipolar field created by a polarization source present in one compartment and experienced by protons in another compartment, a sealed cylindrical capillary tube 1.1 mm in external diameter chiefly containing deuterated benzene was inserted into the previous tube. This is the configuration of FIG. 2B where the capillary tube corresponds to the compartment 25. The external compartment 23 contained a solution, the solvent for which was perdeuterated cyclohexane and 0.7% chloroform (purity 99%, analysis grade by Merck). Impurities present in trace form yield various fine lines with shorter $^1$H relaxation times. The same experimental procedure was used as before (addition of xenon that has been negatively polarized to a level of 6.4%, agitation, adjustment of homogeneity, stopping the locking of the field $B_0$, and starting the sequence 50).

Figure 6:
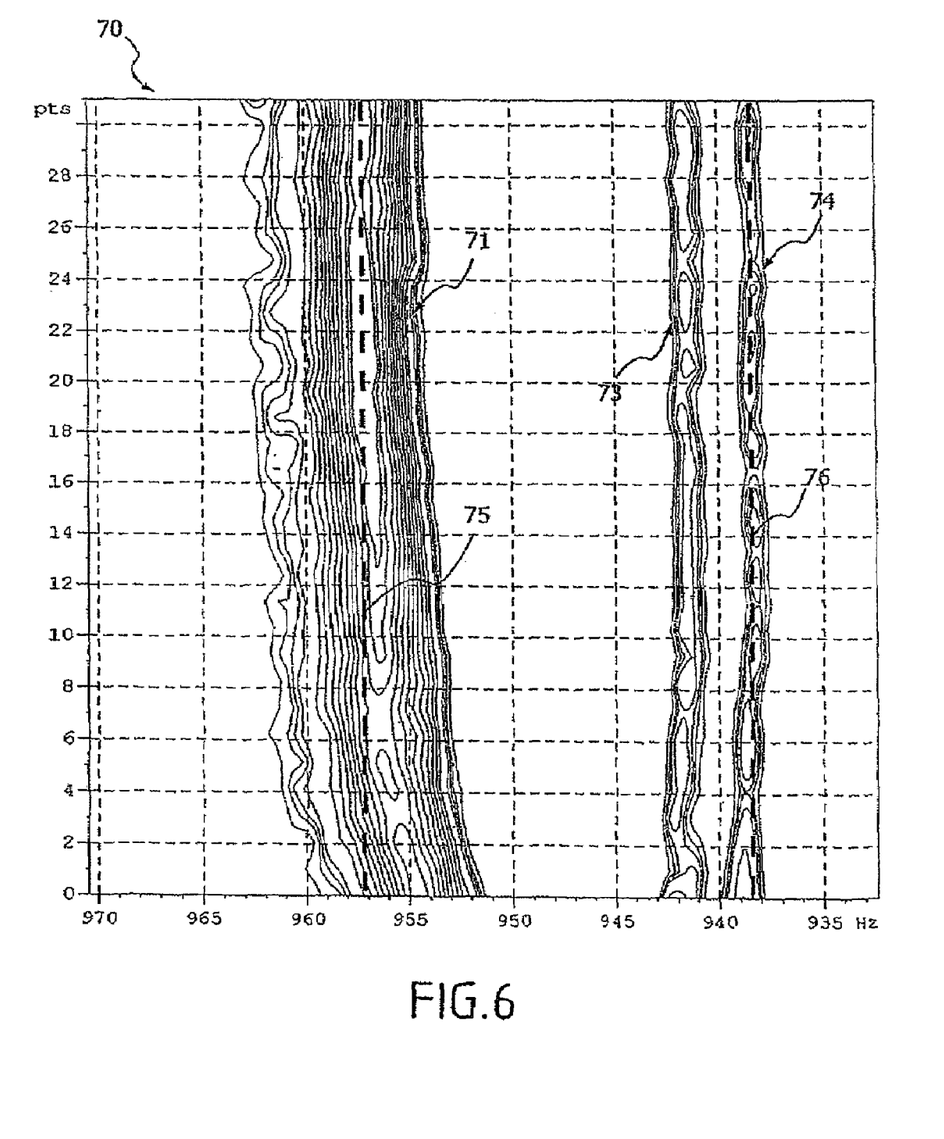
FIG. 6 illustrates the variation, as a function of the number of pulses applied to the xenon nuclei, in the resonant frequencies of protons contained in two distinct compartments just one of which contains polarized xenon, according to the invention.

The map 70 of FIG. 6 corresponds to a sub-portion of the two-dimensional spectrum obtained. The horizontal dimension corresponds to the proton resonant frequency dimension and the vertical dimension corresponds to the series of spectra. This map is depicted in the form of a series of level curves. Distinct behavior in the vertical dimension can be clearly seen on peaks 71, 73 and 74 when these are compared with a constant frequency illustrated by the two dotted lines 75 and 76. The plot of the left-hand peak 71 sees an increase in frequency during the experiment, while the plot of the right-hand pair 73 and 74 sees a decrease in frequency. Likewise, the intensity of the peak 71 increases throughout the experiment while the reduction in magnetization of the polarized xenon leads to a weaker SPINOE effect and therefore to an increase in the proton signal because $T_{Xe}<0$. Determining the maximum frequency of these peaks for each spectrum and adjusting using the above procedure leads to a dipolar coupling $\delta$ of 5.4±0.3 Hz for the peaks (of the peak 71 type) corresponding to the compartment 23 in which the xenon is dissolved and of the order of −1.2±0.5 Hz for the peaks (of the peaks 73 and 74 type) of the internal compartment 25. A quick magnetostatic calculation clearly demonstrates that the magnetic field created by the polarized xenon in the internal cylinder (compartment 23, the compartment in which there is no xenon) has to be of opposite sign to the magnetic field in the external cylinder (compartment 25).

With dipolar coupling of the order of 2 to 4 Hz between the xenons and the protons and the use of two distinct coils 41 and 43 to create the two irradiations 13 and 15, a Hartmann-Hahn coherence transfer can take place effectively only if the difference in amplitude of the radiofrequency fields $|\omega_1^{\,1}-\omega_1^{\,s}|$ is typically below this value.

As the radiofrequency fields are known to be inhomogeneous, and when use is being made of a conventional probe wherein the two, proton and xenon, channels correspond to different coils 41 and 43, where there is therefore no correlation of the inhomogeneities of the radiofrequency field, it is inadvisable to use strong radiofrequency fields in which the inhomogeneities would be far greater than the dipolar coupling. Under these circumstances, it is preferable to resort to the simplest Hartmann-Hahn transfer sequence with low-power continuous irradiation.

Figure 7:
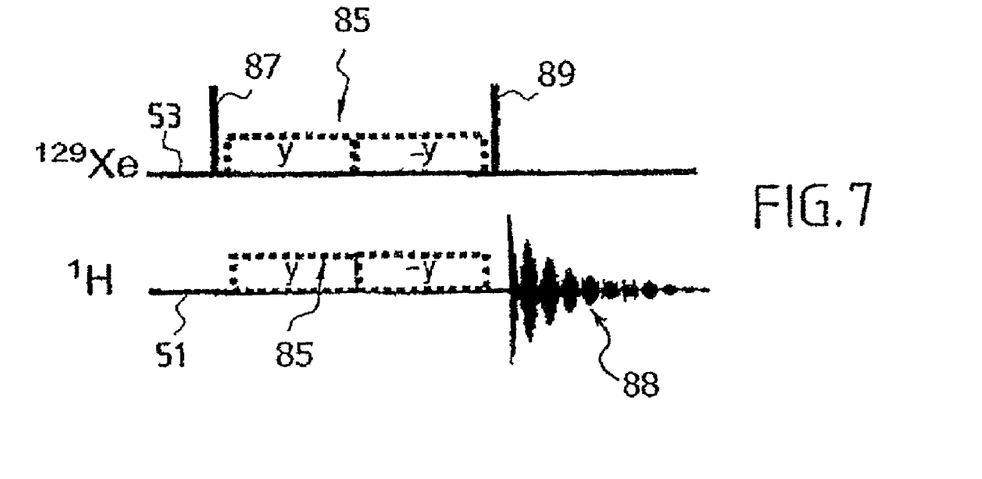
FIG. 7 illustrates a sequence of pulses which is used to observe the transfer of polarization from the xenon to the protons of said solution, according to the invention.

In effect, FIG. 7 illustrates a pulse sequence used to observe the transfer of polarization from the xenon 9 to the protons 7 using the average dipolar coupling. The spin lock 85 on the xenon channel 53 is between two pulses 87 and 89 of 90° and opposite phase (x and −x) intended to place the magnetization of the xenon 9 in the transverse plane initially and along the static field at the end of the mixing time $T_m$. The spin lock 85 is applied simultaneously to the proton channel 51 and to the xenon channel 53 with exactly the same radiofrequency field amplitude $|\omega_1^{\,1}-\omega_1^{\,s}|=0$. The proton signal 88 is detected after the spin lock 85.

In addition, simply reversing the phase of the irradiation by 180° in the middle of the irradiation time is also performed in order partially to compensate for the effects of the inhomogeneity of the radiofrequency fields. In this example, it is preferable to use low-amplitude radiofrequency fields so that the inhomogeneity is of the order of the dipolar coupling measured. Measuring the amplitude of the xenon (or proton) radiofrequency field consists, in the known way, of nutating the magnetization of the xenon (or of the proton) followed by a purge gradient and a read pulse. In order to avoid any artefact in the measurement, irradiation of increasing duration is applied simultaneously to both proton and xenon channels 51 and 53. Thus, it is possible to determine the Hartmann-Hahn conditions, $|\omega_1^{\,1}=\omega_1^{\,s}|$, to within 1 Hz. By way of example, it is possible to employ a radiofrequency field in which the field inhomogeneity (line width at half-height) is of the order of 1.8 Hz, and in which the field amplitude $|\omega_1^{\,1}/2\pi|$ is 46.87 Hz for maximum probability.

Figure 8:
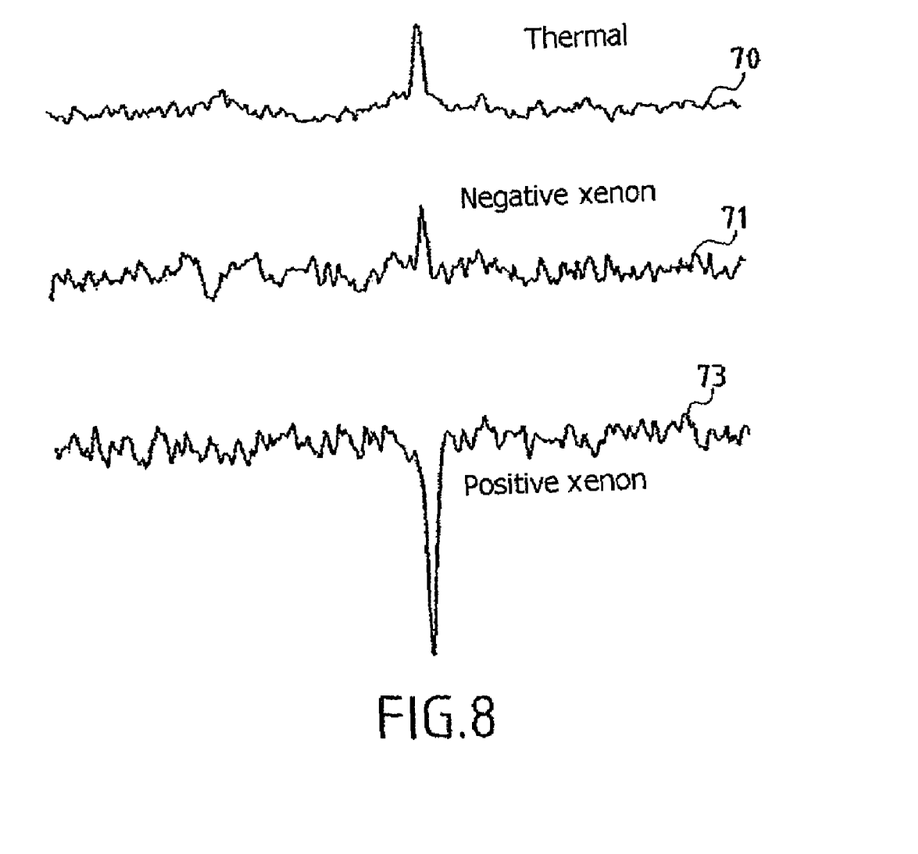
FIG. 8 shows the spectra obtained after transfer of polarization from the xenon to the protons using negative and positive polarization of the xenon, according to the invention.

By using the sequence of FIG. 7, with irradiation applied for $T_m=800$ ms, the proton spectra 91 and 93 shown in FIG. 8 are obtained with xenon polarizations of opposite sign.

In effect, FIG. 8 shows a first spectrum 90 corresponding to the thermal signal of a proton, a second spectrum 91 obtained with negative polarization of the xenon with respect to the thermodynamic polarization and after use of the excitation method described above (see FIG. 7), and a third spectrum 93 obtained with positive polarization of the xenon with respect to the thermodynamic polarization and use of the excitation method described above (see FIG. 7).

The proton signals 91 and 93 obtained correspond respectively to 0.40 times and to −1.85 times the thermal signal 90 of this same proton. Thanks to the xenon magnetization measured before these spectra were acquired, it is possible to estimate a xenon-proton dipolar coupling $\delta$ of 2.9 Hz and −2.1 Hz respectively.

As an alternative, it is conceivable to replace the spin lock 85 with a sequence of composite pulses, it being possible for the irradiations to be caused by probes with a single dual-tuned or triple-tuned coil, that is to say wherein the coils 41 and 43 are identical. $^1$H, $^{129}$Xe dual-tuning would provide very good correlation between the radiofrequency fields because the same coil would be used to create the excitation field.

It will be noted that the implementation involving two pulses of 90° on the xenon bounding the irradiations to Hartmann-Hahn conditions, can easily be included in the recoupling sequence. Immediate extension of the methods of adiabatic demagnetization in the rotating frame for which there is adiabatic rotation of the magnetization of the xenon, followed by adiabatic reduction in the amplitude of the radiofrequency field (so as to satisfy the Hartmann-Hahn conditions by virtue of another irradiation of the proton) followed by a return of the magnetization of the xenon in accordance with $B_0$ through a further adiabatic rotation is entirely feasible. Let us finally note that it is also possible, in order to enhance the proton signal, to make use of the magnetization thereof at thermodynamic equilibrium (equation 3) via a pulse on the proton channel preceding the spin lock 85. The phase of this pulse is obviously dependent on the sign of the xenon polarization.

REFERENCES OF CITED DOCUMENTS

1. S. R. Hartmann and E. I. Hahn, *Nuclear double resonance in the rotating frame*. Phys, Rev., (1962) 128 2042-2053.
2. M. G. Schwendinger, J. Quant, J. Schleucher, S. J. Glaser and C. Griesinger, *Broadband heteronuclear Hartmann-Hahn sequences*. J. Magn. Reson. A, (1994) 111 115-120.
3. S. J. Glaser and J. J. Quant, *Homonuclear and heteronuclear Hartmann-Hahn transfer in isotropic liquids*, in *Adv. Magn. Opt. Reson.*, W. S. Warren, Editor. (1996), Academic Press Inc.: San Diego, p. 59-252.
4. W. Richter, S. Lee, W. S. Warren and Q. He, *Imaging with intermolecular multiple-quantum coherences in solution nuclear magnetic resonance*. Science, (1995) 267 654-657.
5. H. W. Long, H. C. Gaede, J. Shore, L. Reven, C. R. Bowers, J. Kritzenberger, T. Pietrass, A. Pines, P. Tang and J. A. Reimer, *High-field cross polarization NMR from laser-polarized xenon to a polymer surface*. J. Am. Chem. Soc., (1993) 115 8491-8492.
6. J. Smith, L. J. Smith, K. Knagge, E. MacNamara and D. Raftery, *Hyperpolarized xenon-mediated cross-polarization to material surfaces observed at room temperature and above*. J. Am. Chem. Soc., (2001) 123 2927-2928.

The invention claimed is:

1. A method for carrying out an NMR analysis of a liquid solution containing nuclei with nonzero nuclear spins, comprising irradiating the spins of the nuclei of a polarization source and said spins of the nuclei of said liquid solution to achieve a Hartmann-Hahn-type transfer of polarization from the spins of the nuclei of said source to the spins of the nuclei of said liquid solution by means of a coherent coupling resulting from the dipolar field created by the nuclei of the source so as to obtain an NMR signal from said liquid solution that is enhanced by comparison with the value it would have had at thermodynamic equilibrium, and determining or verifying the chemical composition of said liquid solution based upon said NMR signal.

2. The method as claimed in claim 1, wherein said dipolar field is obtained as a result of a concentration higher than 0.01 mol/l-1 and/or of a polarization greater than 0.01 of the nuclei of said polarization source.

3. The method as claimed in claim 1, wherein the spins of the nuclei of said liquid solution and the spins of the nuclei of said polarization source are subjected simultaneously to respective first and second irradiations in radiofrequency fields, which are independently of the continuous or composite type, so as to achieve said polarization transfer.

4. The method as claimed in claim 3, wherein said first and second irradiations are at frequencies that are respectively substantially equal, to within 200 kHz, to the resonant frequencies of the spins of the nuclei of said liquid solution and of the spins of the nuclei of said polarization source.

5. The method as claimed in claim 3, wherein the values of the precession frequencies of the spins of the nuclei resulting from said first and second irradiations respectively, differ from one another by less than ten times the amplitude, expressed in frequency units, of said dipolar field.

6. The method as claimed in claim 5, wherein the values of the precession frequencies of the spins of the nuclei resulting from said first and second irradiations respectively, differ from one another by less than the amplitude, expressed in frequency units, of said dipolar field.

7. The method as claimed in claim 3, wherein said polarization transfer is performed via composite or multi-pulse sequences of said irradiations, for which there is an effective magnetic field.

8. The method as claimed in claim 1, wherein said polarization source is obtained, as desired:
   by adding para-hydrogen to a carbon-carbon double bond,
   by prepolarizing a sample using the solid phase low temperature dynamic nuclear polarization method followed by dissolving said sample in a liquid, or
   by optical pumping of at least one polarized rare gas chosen from the group consisting of isotopes of xenon, helium, neon and krypton.

9. The method as claimed in claim 8, wherein said polarization source is obtained by optical pumping of at least one polarized rare gas chosen from the group consisting of isotopes of xenon, helium, neon and krypton.

10. The method as claimed in claim 9, wherein said or at least one of said rare gas or gases is xenon-129 or helium-3.

11. The method as claimed in claim 9, wherein said or at least one of said rare gas or gases is the xenon-129 isotope.

12. The method as claimed in claim 1, wherein said polarization source is dissolved in said liquid solution.

13. The method as claimed in claim 1, wherein said polarization source is physically separated from said liquid solution.

14. The method as claimed in claim 13, wherein said polarization source and said liquid solution are respectively contained in two adjacent and mutually independent compartments.

15. The method as claimed in claim 13, wherein said liquid solution is contained in an internal compartment which is surrounded by an external compartment containing said polarization source.

16. The method as claimed in claim 13, wherein said polarization source is separated from said liquid solution by a distance representing the effective range of said dipolar field which is equal to or greater than 1 nanometer.

17. The method as claimed in claim 16, wherein said polarization source is separated from said liquid solution by a distance representing the range of said dipolar field which ranges between 3 nanometers and 10 millimeters.

18. The method as claimed in claim 13, wherein said or at least one of said rare gas or gases is the helium-3 isotope.

19. The method as claimed in claim 1, wherein said polarization source is in the gaseous phase.

20. The method as claimed in claim 1, wherein the nuclei of said liquid solution comprise hydrogen nuclei.

21. The method as claimed in claim 1, wherein the nuclei of said liquid solution comprise carbon-13 nuclei.

22. A system for performing an NMR analysis of a liquid solution containing nuclei with nonzero nuclear spins, comprising a magnet surrounding:
   a polarization source,
   polarization transfer means designed to irradiate the spins of nuclei of said polarization source and said spins of the nuclei of said liquid
   solutions to achieve a Hartmann-Hahn-type transfer of polarization from the spins of the nuclei of said source to the spins of the nuclei of said liquid solution by means of a coherent coupling resulting from the dipolar field created by the nuclei of the source so as to obtain an NMR signal from said liquid solution that is enhanced by comparison with the value it would have had at thermodynamic equilibrium.

23. The system as claimed in claim 22, wherein said polarization transfer means comprise:
   a first irradiation means designed to subject the spins of the nuclei of said liquid solution to a first irradiation in radiofrequency fields of a continuous or composite type, and
   a second irradiation means designed to subject the spins of the nuclei of said polarization source to a second irradiation in radiofrequency fields of continuous or composite type.

24. The system as claimed in claim 22, wherein said dipolar field is obtained as a result of a concentration higher than 0.01 mol/l-1 and/or of a polarization greater than 0.01 of the nuclei of said polarization source.

25. The system as claimed in claim 22, wherein said polarization source is obtained, as desired:
   by adding para-hydrogen to a carbon-carbon double bond,
   by prepolarizing a sample using the solid phase low temperature dynamic nuclear polarization method followed by dissolving said sample in a liquid, or
   by optical pumping of at least one polarized rare gas chosen from the group consisting of isotopes of xenon, helium, neon and krypton.

26. The system as claimed in claim 25, wherein said polarization source is obtained by optical pumping of at least one polarized rare gas chosen from the group consisting of isotopes of xenon, helium, neon and krypton.

27. The system as claimed in claim 22, comprising, inside said magnet, a tube containing said polarization source dissolved in said liquid solution.

28. The system as claimed in claim 22, comprising, inside said magnet, a container comprising two adjacent and mutually independent compartments which are intended, one of them to contain said polarization source and the other to contain said liquid solution.

29. The system as claimed in claim 28, wherein said polarization source is in the gaseous phase.

30. The system as claimed in claim 28, wherein said two compartments are separated by a distance representing the range of said dipolar field which ranges between 3 nanometers and 10 millimeters.

31. The system as claimed in one claim 22, comprising, inside said magnet, a container comprising two compartments, one internal and one external, said external compartment being intended to contain said polarization source and surrounding said internal compartment which is intended to contain said liquid solution.

* * * * *